(12) United States Patent
Chen et al.

(10) Patent No.: US 10,114,049 B2
(45) Date of Patent: Oct. 30, 2018

(54) APPARATUS FOR INPUT POWER DETECTION AND METHOD THEREOF

(71) Applicant: CANYON SEMICONDUCTOR INC., Hsinchu (TW)

(72) Inventors: Chi-Ming Chen, Hsinchu (TW); Ding-Yu Wei, Hsinchu (TW)

(73) Assignee: CANYON SEMICONDUCTOR INC., Hsinchu (TW)

( * ) Notice: Subject to any disclaimer, the term of this patent is extended or adjusted under 35 U.S.C. 154(b) by 252 days.

(21) Appl. No.: 15/154,521

(22) Filed: May 13, 2016

(65) Prior Publication Data

US 2016/0356829 A1  Dec. 8, 2016

(30) Foreign Application Priority Data

Jun. 2, 2015  (TW) .............................. 104117734 A

(51) Int. Cl.
*G01R 21/133*  (2006.01)
*G01R 21/127*  (2006.01)
*H02J 7/00*  (2006.01)

(52) U.S. Cl.
CPC .......... *G01R 21/127* (2013.01); *H02J 7/0052* (2013.01)

(58) Field of Classification Search
CPC ...... G01R 15/185; G01R 19/03; G01R 19/18; G01R 19/22; H01L 41/044
See application file for complete search history.

(56) References Cited

U.S. PATENT DOCUMENTS

| | | | | |
|---|---|---|---|---|
| 2012/0313571 | A1* | 12/2012 | Knowlton | H02J 7/007 320/107 |
| 2016/0202743 | A1* | 7/2016 | Li | G06F 1/26 710/313 |

\* cited by examiner

*Primary Examiner* — Tung X Nguyen
(74) *Attorney, Agent, or Firm* — Christensen, Fonder, Dardi & Herbert PLLC

(57) ABSTRACT

An electronic device includes an input power detection unit, a transmission control unit and a converter. The input power detection unit is configured to determine an input voltage value and an input current value of an input power. In response to the input power, the transmission control unit is configured to determine a first voltage value and a first current value associated with another electronic device via a handshake process. The voltage converter is configured to convert the input power into a first power required by the another electronic device.

15 Claims, 5 Drawing Sheets

APPARATUS FOR INPUT POWER DETECTION AND METHOD THEREOF

CROSS-REFERENCE TO RELATED APPLICATIONS

This application claims priority to TW Application Serial No. 104117734 filed on Jun. 2, 2015, the disclosure of which is hereby incorporated by reference in its entirety.

BACKGROUND

The last decade has witnessed the expanding use of handheld electronic devices. Although handheld devices are easily carried, they rely on power from batteries and further from power supplying devices in case the battery power is exhausted. Handheld electronic devices can be charged through a transformer or voltage converter in compliance with specific requirements. However, the charging voltage designed for one electronic device may be fixed and cannot be adapted to another electronic device.

As personal handheld electronic devices continue to thrive, charging requirements and specifications for different electronic devices become diversified. To address the need to charge different electronic devices, one should prepare more than one transformers or voltage converters to deal with different charging standards. Thus, it may be desirable to improve existing transformers or voltage converters in order to meet the charging requirements for various handheld electronic devices.

SUMMARY

The present disclosures provides an electronic device to alleviate these problems. In a first aspect of the present disclosures, an electronic device comprises an input power detection unit, a transmission control unit and a voltage converter. The input power detection unit is configured to detect an input voltage value and an input current value of an input power. The transmission control unit is configured to determine a first voltage value and a first current value based on a handshake process. The voltage converter is configured to provide a first power in response to the input power and the transmission control unit, wherein the first power has the first voltage value and the first current value.

In a second aspect of the present disclosures, a method for detecting power comprises: receiving a detection voltage value of the input power; determining an input voltage value of the input power based on the detection voltage value; generating a first pulse having a first amplitude; generating a control current based on the first pulse; and determining the current value as an input current value in response to the detection voltage value dropping down to or below a threshold voltage value.

When the input voltage value and the input current value of the input power are determined, the power capacity supported by the input power is ascertained. Furthermore, the power capacity of the input power would determine the maximum delivered power of the first power determine. Subsequently, the first voltage value is determined as the charging voltage for a device to be charged through the handshake process. Then, the first current value would be determined is determined based on the first voltage value and the charging capacity of the input power. Therefore, the first voltage value and the first current value are compatible with the charging property for the charged device, and the charging process can thus be completed efficiently.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
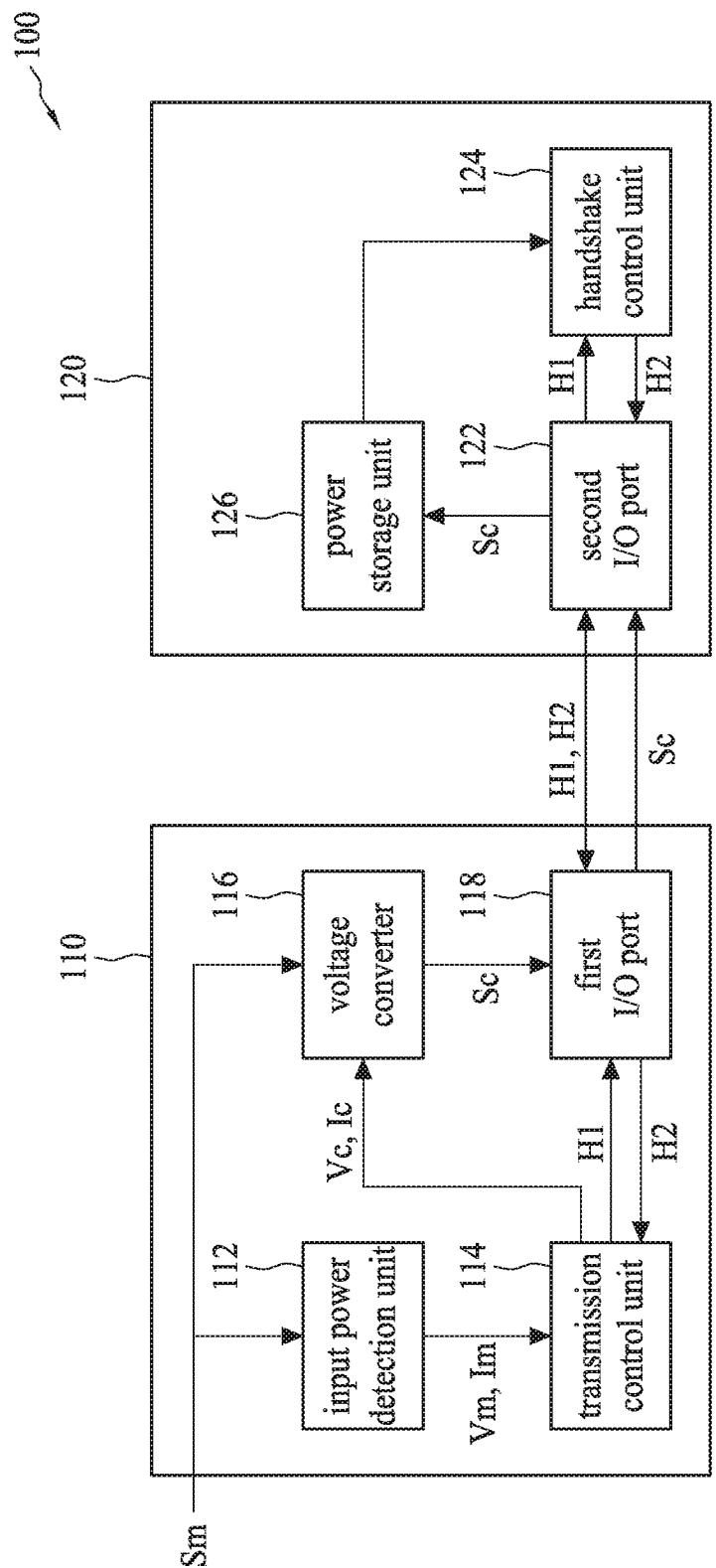
FIG. 1 shows a block diagram of a charging system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a block diagram of a charging system 100 in accordance with some embodiments. Referring to FIG. 1, the charging system 100 includes a first device 110 and a second device 120. The first device 110 is configured to supply power to the second device 120. In some embodiments, the first device 110 includes a charger, adapter, or other suitable electronic devices. The first device 110 includes an input power detection unit 112, a transmission control unit 114, a voltage converter 116 and a first input/output (I/O) port 118.

The input power detection unit 112 is configured to determine the power magnitude of an input power Sm, received via an input terminal of the first device 110. The input power Sm is provided in direct current (DC) form. In some embodiments, the input power Sm is received from an alternating current (AC) source via an AC/DC adapter. In addition, the input power Sm is measured and then represented by its voltage value and current value, whereby the power magnitude can be derived from the voltage value and the current value thereof. Further, the input power detection unit 112 is configured to determine an input voltage Vm and an input current Im based on the measured voltage and current of the input power Sm. Also, the input power detection unit 112 is configured to transmit the information on the input voltage Vm and input current Im to the transmission control unit 114.

The transmission control unit 114 is configured to determine whether the first device 110 charges the second device 120. Specifically, the transmission control unit 114 is configured to determine when to start or when to stop the charging of the second device 120 with a first power Sc, where the first power Sc provides a first voltage Vc and a first current Ic. To determine a starting or ending time point, a handshake process between the first device 110 and the second device 120 is conducted. In addition, the transmission control unit 114 is configured to transmit the first voltage value Vc and the first current value Ic to the voltage converter 116.

In some embodiments, during the handshake process a first handshake signal H1 is generated by the transmission control unit 114 and sent to the second device 120 via the first I/O port 118. Subsequently, a second handshake signal H2 from the second device 120 via the first I/O port 118 is received at the transmission control unit 114. In some embodiments, the first handshake signal H1 comprises a first information on options regarding the first voltage value Vc and the first current value Ic supported by the first device 110. The second handshake signal H2 comprises a second information on the first voltage value Vc and the first current value Ic permissible by the second device 120.

In some embodiments, the transmission control unit 114 is configured to receive a matching result of the handshake process. The matching result indicates if a matching of power is successful or unsuccessful. The transmission control unit 114 is configured to determine whether to charge the second device 120 with the first power Sc by comparing the charging information in the first handshake signal H1 and the second handshake signal H2. When the matching result is successful, the first device 110 and the second device 120 agree to supply power. Also, the charging specification, i.e., the first voltage value Vc and the first current value Ic, is determined through the handshake process. On the other hand, if the matching result is unsuccessful, then the first device 110 is configured not to supply power with the first power Sc. In order to ensure an affordable charging capability, the first voltage value Vc determined by the transmission control unit 114 through the handshake process is not greater than the input voltage value Vm determined by the input power detection unit 112. Similarly, the first current value Ic determined by the transmission control unit 114 through the handshake process is not greater than the input current value Im determined by the input power detection unit 112.

The voltage converter 116 receives the input power Sm via the input terminal, and converts the input power Sm into the first power Sc. In addition, the voltage converter 116 is configured to provide the first power Sc with the voltage and current specification provided from the transmission control unit 114. The first power Sc is delivered with the first voltage value Vc and the first current value Ic as agreed upon by the first device 110 and the second device 120. In addition, the first power Sc is transmitted to the second device 120 via the first I/O port 118. In an embodiment, the voltage converter 116 includes a regulator.

The first I/O port 118, coupled into the voltage converter 116, is configured to receive the first power Sc provided by the voltage converter 116 and transmit the first power Sc to the second device 120. Further, the first I/O port 118, coupled to the transmission control unit 114, is configured to send the first handshake signal H1 generated by the transmission control unit 114 to the second device 120. Additionally, the first I/O port 118 is configured to send the second handshake signal H2 to the transmission control unit 114. In some embodiments, the first I/O port 118 includes a universal serial bus (USB) I/O port.

The second device 120 includes a second input/output (I/O) port 122, a handshake control unit 124 and a power storage unit 126. In some embodiments, the second device 120 includes a laptop, a handheld computer, a smart phone, a portable power storage, or other battery-embedded electronic products.

The handshake control unit 124, coupled to the second I/O port 122, is configured to perform the handshake process in conjunction with the transmission the control unit 114 of the first device 110. In some embodiments, the handshake control unit 124 is configured to generate the second handshake signal H2 in the handshake process and transmit the same to the first device 110 via the second I/O port 122. In other embodiments, the handshake control unit 124 is configured to receive the first handshake signal H1 sent by the first device 110.

The second I/O port 122 is configured to receive the first power Sc through the first I/O port 118, and transmit the first power Sc to the power storage unit 126. In addition, the second I/O port 122, coupled to the handshake control unit 124, is configured to transmit the first handshake signal H1 and the second handshake signal H2 between the transmission control unit 114 and the handshake control unit 124. In some embodiments, the second I/O port 122 includes a universal serial bus (USB) I/O port.

The power storage unit 126 receives and stores the first power Sc via the second I/O port 122. In some embodiments, the handshake control unit 124 is configured to detect the present voltage value and/or the present current value of the power storage unit 126.

Since the input voltage value Vm and the input current value Im of the input power Sm are determined, the power capacity supported by the input power Sm is ascertained. Furthermore, the maximum power that can be supplied by the first power Sc is determined accordingly. Subsequently, the charging voltage for the second device 120 is ensured given the first voltage value Vc provided by the transmission control unit 114. Then, the first device 110 may determine a maximum first current value Ic based on the first voltage value Vc given the charging capacity of the input power. The charging process can thus be completed efficiently.

Figure 2:
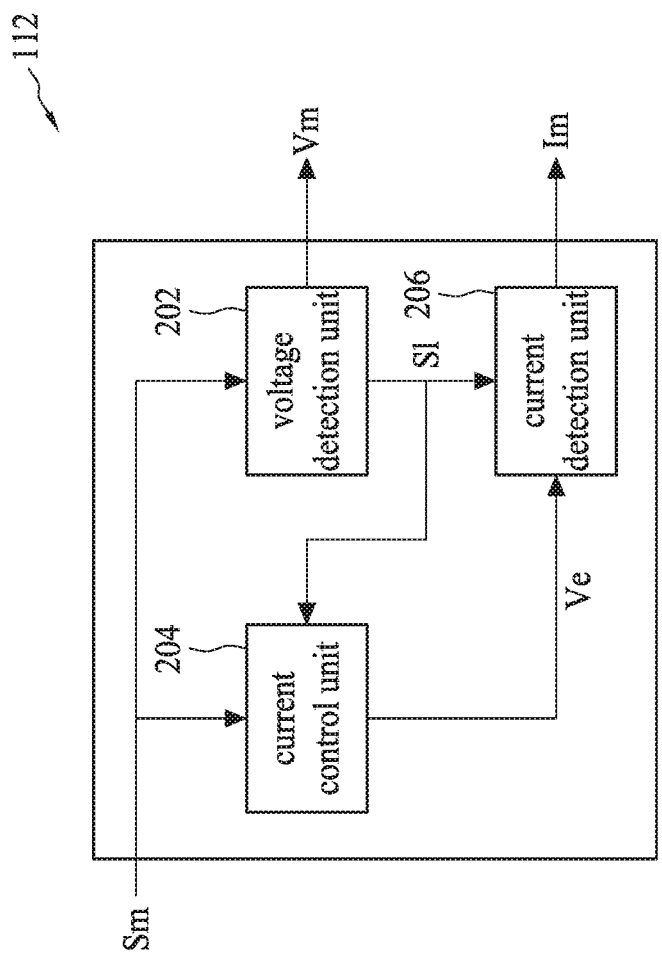
FIG. 2 shows a block diagram of an input power detection unit in the charging system of FIG. 1, in accordance with some embodiments.

FIG. 2 shows a block diagram of an input power detection unit 112 in the charging system of FIG. 1, in accordance with some embodiments. The input power detection unit 112 is configured to receive the input power Sm, detect the input voltage value Vm and the input current value Im, and transmit the information on the input voltage Vm and the input current Im to the transmission control unit 114. Referring to FIG. 2, the input voltage detection unit 112 includes a voltage detection unit 202, a current control unit 204 and a current detection unit 206.

The voltage detection unit 202 is connected to the input power Sm via an input terminal thereof, and receives a detection voltage Vd. Then the voltage detection unit 202 is configured to determine the input voltage Vm based on the detection voltage value Vd, assuming that the voltage level of the input power Sm is in DC form. In some embodiments, the voltage detection unit 202 acquires one detection voltage Vd and determines the input voltage value Vm from that detection voltage Vd. In other embodiments, the voltage detection unit 202 acquires more than one detection voltages Vd, and the input voltage Vm is calculated based on the detection voltages Vd. For example, a maximum or averaged value of the detection voltages Vd is set as the input voltage Vm. In some embodiments, the voltage detection unit 202 is configured to limit the range of input for the sake of protection, such that the voltage detection unit 202 and the input power detection unit 112 may not be damaged due to over-voltage.

Further, the voltage detection unit 202 is configured to keep receiving the detection voltages Vd after the input voltage value Vm is determined. In an embodiment, in response to detecting at least one voltage value Vd dropping to or below a threshold voltage value Vx, the voltage detection unit 202 is configured to send a signal comprising information on the voltage dropping for the input power Sm to the current detection unit 206. In some embodiments, the voltage detection unit 202 is configured to issue a latching signal S1 as notification to the current detection unit 206. In some embodiments, the threshold voltage value Vx is a predetermined value, in which the value is related to the input voltage Vm, e.g., the threshold voltage value Vx is correlated with the input voltage value Vm by a difference voltage Va. For example, Vx=Vm−Va, where Vm=110 volts, Vx=100 volts and Va=10 volts. In other embodiments, the threshold voltage value Vx is correlated with the input voltage Vm in a proportional relationship. For example, Vx=Vm*p, where 0<p<1, such as p=0.9. While the descriptions above illustrate embodiments for determining the threshold voltage Vx, the decision of the threshold voltage Vx is not limited to the present disclosure, and any other suitable embodiments also fall within the scope of the present invention.

The current control unit 204 is configured to, in response to the input power Sm, generate a second voltage value Ve and a second current value Ie. In addition, the detection voltage Vd received in the voltage detection unit 202 may change with the second current Ie. In other words, when the second current Ie generated by the current control unit 204 falls within the normal range of the input current value Im, the input power Sm would not be impacted. Thus, the observed detection voltage value Vd remains or fluctuates within tolerance margins. However, when the current generated by the current control unit 204 exceeds the normal capacity of the input power Sm, at least one detection voltage value Vd decreases along with the increase of the second current value Ie. Under that situation, at least one detection voltage value Vd drops down to or below the threshold voltage Vx, and the input power detection unit 112 is configured to determine the second current value Ie as the input current value Im.

In some embodiments, the current control unit 204 and the voltage detection unit 202 are configured in parallel connection. In other embodiments, the current control unit 204 is configured to terminate the second current Ie in response to at least one detection voltage value Vd dropping down to or below the threshold voltage value Vx. In other embodiments, the current control unit 204, further coupled to the voltage detection unit 202, is configured to receive the latching signal S1, and terminates the second current Ie in response to the latching signal S1.

The current detection unit 206 is configured to receive a second voltage value Ve. In one embodiment, the current detection unit 206 is configured, in response to the latching signal S1, to set the second current value Ie as the input current value Im. The second current value corresponds to the second voltage value Ve. In another embodiment, the current detection unit 206 is configured, in response to the second voltage value Ve, to determine the input current value Im. In other embodiments, the current detection unit 206 is configured to determine the second current value Ie as the input current value Im in response to the detection voltage value Vd dropping down to or below the threshold voltage Vx. In other embodiments, the voltage detection unit 206 is configured to transmit the latching signal S1 to the current detection unit 206 in response to the detection voltage value Vd dropping down to or below the threshold voltage Vx, whereby the second current value Ie is determined as the input current value Im.

Figure 3:
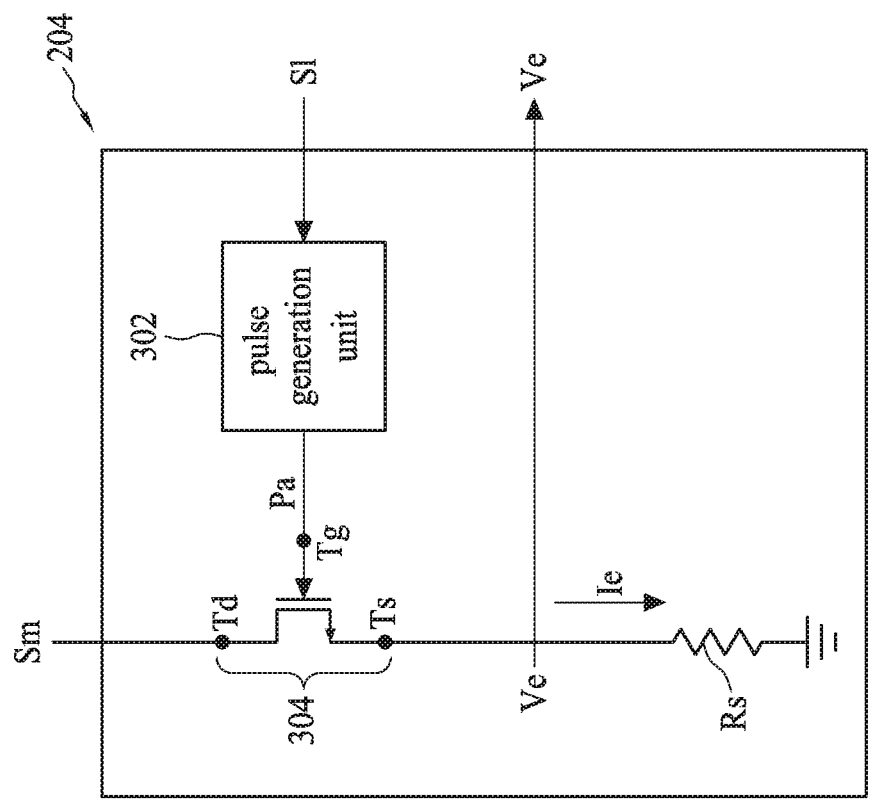
FIG. 3 shows a block diagram of a current control unit in the input power detection unit of FIG. 2, in accordance with some embodiments.

During operation, the input power detection unit 112 is configured to receive the input power Sm and determine the input voltage value Vm and the input current value Im. On the one hand, the voltage detection unit 202 is configured to receive the detection voltage Vd and determine the input voltage Vm value based on the detection voltage Vd. In addition, the voltage detection unit 202 is configured to transmit the latching signal S1 to the current detection unit 206 in response to the continuously received detection voltage Vd decreasing to the threshold voltage value Vx. On the other hand, the current control unit 204 is configured to generate a second voltage value Ve corresponding to the second current value Ie, and transmit the second voltage value Ve to the current detection unit 206. Further, the current detection unit 206 is configured to determine the second current value Ie as the input current value Im in response to the detection voltage Vd dropping down to or below the threshold voltage Vx, or in response to the latching signal S1. FIG. 3 shows a block diagram of the current control unit 204 in the input power detection unit of FIG. 2, in accordance with some embodiments. Referring to FIG. 3, the current control unit 204 comprises a pulse generation unit 302, a transistor 304 and a resistor Rs.

The pulse generation unit 302 is configured to output a pulse sequence (i.e., pulse train) to the transistor 304. In some embodiments, the pulse generation unit 302 is configured to generate the pulse sequence after it is activated. In other embodiments, the pulse generation unit 302 is configured to generate the pulse sequence in response to the input power Sm detected by the voltage detection unit 202. In addition, the pulse generation unit 302 is configured to determine parameters of the pulse sequence. The pulse sequence contains at least one pulse, and the pulse parameters include the pulse period Pt, pulse amplitude Pa, pulse width Pw and other suitable parameters. In some embodiments, the pulse parameters are stored in the pulse generation unit 302, or a memory unit (not shown). The memory unit may be disposed outside the input power detection unit 112, inside the input power detection unit 112 and outside the pulse generation unit 302 while being coupled to the pulse generation unit 302, or inside the pulse generation unit within 302. In other embodiments, the first device 110 includes a processor (not shown), and the pulse parameters are determined and provided by the processor. The processor may be disposed outside the input power detection unit 112, inside the input power detection unit 112 and outside the pulse generation unit 302 while being coupled to the pulse generation unit 302, or inside the pulse generation unit 302.

In some embodiments, for the successive pulses of the pulse sequence generated by the pulse generation unit 302, the pulse amplitudes Pa are of a same value. In other embodiments, however, each of the pulse amplitudes may be different. For example, the amplitudes for the successive pulses increase unless a maximum amplitude is reached. Furthermore, the pulse generation unit 302 is coupled to the transistors 304 and configured to control the transistor 304, whereby a second voltage value Ve thereof is generated.

In some embodiments, the pulse generation unit 302 is configured to generate a first pulse and transmit the first pulse to the transistor 304. The pulse generation unit 302 is configured to apply a controlling voltage value in order to control the second current Ie passing through the transistor 304 with the first pulse. In a situation where the current control unit 204 receives the latching signals S1, the current control unit 204 is configured, after activation and before the triggering of the latching signal S1, to output the first pulse with a first amplitude in a first period. In some embodiments, the second current value Ie increases along with the intensified first amplitude.

In response to the detection voltage value Vd not dropping down to or below the threshold voltage value Vx or in response to not receiving the latching signal S1, in some embodiments, during the first period, the pulse generation unit 302 is configured to generate a second pulse in a second period in place of the first pulse. The second pulse has a second amplitude greater than the first amplitude. That means at a time before the detection voltage Vd drops down to or below the threshold voltage value Vx, or before the latching signal S1 is sent, the pulse generation unit 302 is configured to output a plurality of successive pulses with increasing amplitudes, rendering the second voltage values Ve from the transistor 304 with increased second current values Ie in successive periods. When the second current Ie is large enough for pulling the detection voltage Vd to drop down to or below the threshold voltage value Vx, the pulse generation unit 302 is configured, in response to the detection voltage Vd dropping down to or below the threshold voltage value Vx or in response to the latching signal S1, to terminate the pulse sequence.

Referring to FIG. 3, the transistor 304 is coupled to the pulse generation unit 302 and the resistor Rs. In some embodiments, the transistor 304 includes an N-type metal-oxide-semiconductor field-effect transistor (MOSFET), or a P-type MOSFET. The transistor 304 includes a source terminal Ts, a drain terminal Td and a gate terminal Tg. In the case that the transistor 304 is an N-type MOSFET, the drain terminal Td receives the input power Sm via the input terminal, the source terminal Ts is coupled to the source resistance Rs, and the gate terminal Tg is coupled to the pulse generation unit 302. The transistor 304 is configured to receive the pulse sequence at the gate terminal Tg and generate the second current value Ie at the source terminal Ts along with the second voltage value Ve.

Further, the second voltage value Ve corresponds to the second current value Ie via the resistor Rs, i.e. Ve=Ie*Rs. Thus, the second current value Ie can be obtained by measuring the voltage at the source terminal, which is the second voltage value Ve.

Figure 4B:
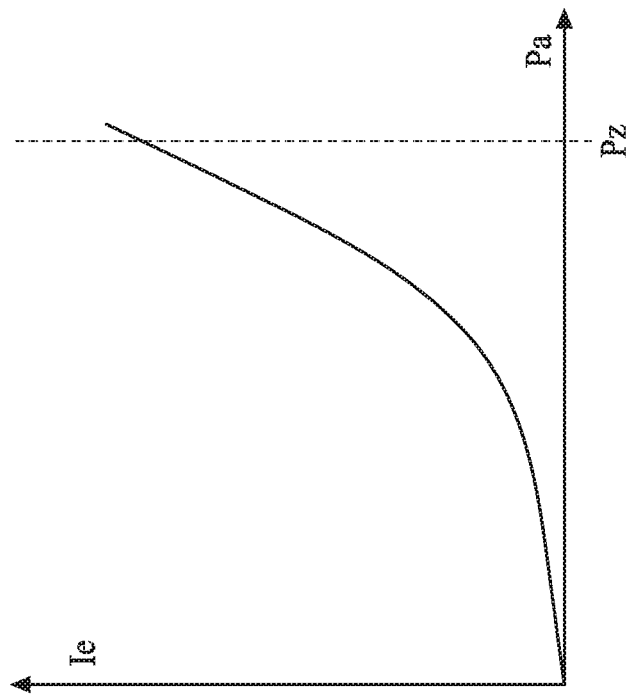
FIGS. 4A and 4B are diagrams showing voltage and current variations, in accordance with some embodiments.
Figure 4A:
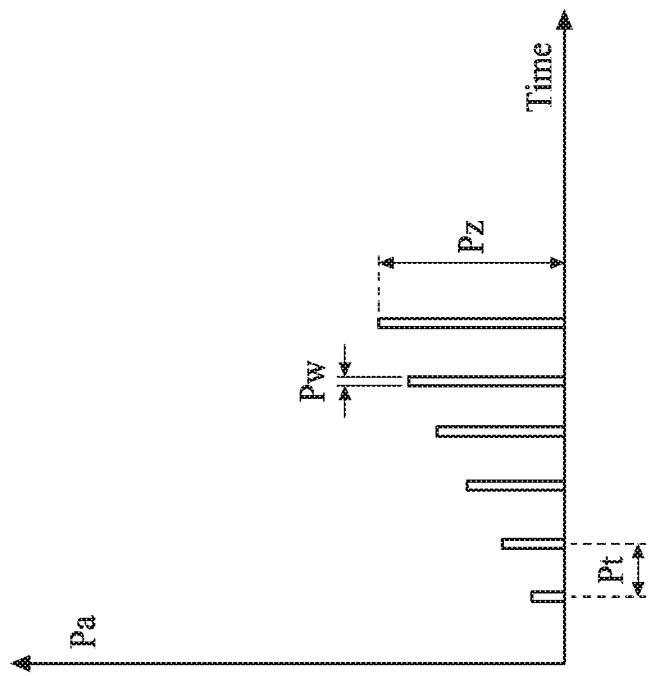

FIGS. 4A and 4B are diagrams showing voltage and current variations, in accordance with some embodiments. FIG. 4A is a schematic graph of a pulse sequence generated by the pulse generation unit 302, wherein the horizontal and vertical axes represent time and voltage value, respectively. Referring to FIG. 4A, the pulse sequence has a pulse period Pt with a respective pulse width Pw. The pulse period Pt, pulse width Pw and pulse amplitude Pa are adjustable in accordance with the system specifications. In some embodiments, the pulse width Pw and the pulse amplitude Pa of each pulse may be different. In each of the pulse periods Pt, the current control unit 204 is configured to generate a second current value Ie, and the voltage detection unit 202 is configured to detect variations of the detection voltage value Vd, whereby the voltage detection unit 202 may notify the current detection unit 206 of voltage dropping. In some embodiments, the pulse width Pw is the time span in which the input power detection unit 112 performs power detection. In addition, a short pulse width Pw may prevent unduly power consumption of the input power detection unit 112, thereby avoiding overheating thereof.

Referring to FIG. 4A, before the decrease of the detection voltage value Vd is detected by the voltage detection unit 202, the amplitudes Pa of the first five pulses generated by the pulse generation unit 302 is increased successively. The sixth pulse is generated with amplitude Pa=Pz. During the period of the sixth pulse, the detection voltage Vd drops down to or below the threshold voltage value Vx.

FIG. 4B shows a variation of the second current value Ie out of the transistor 304, along with the pulse amplitude Pa of the pulse generation unit 302. Referring to FIG. 4B, when the pulse amplitude Pa is made larger, the second current value Ie rises accordingly. In some embodiments, the relationship between the pulse amplitude Pa and the second current value Ie is nonlinear. When the pulse amplitude reaches Pa=Pz, the detection voltage Vd drops down to or below the threshold voltage value Vx. The detection for the input power Sm is terminated accordingly.

Figure 5:
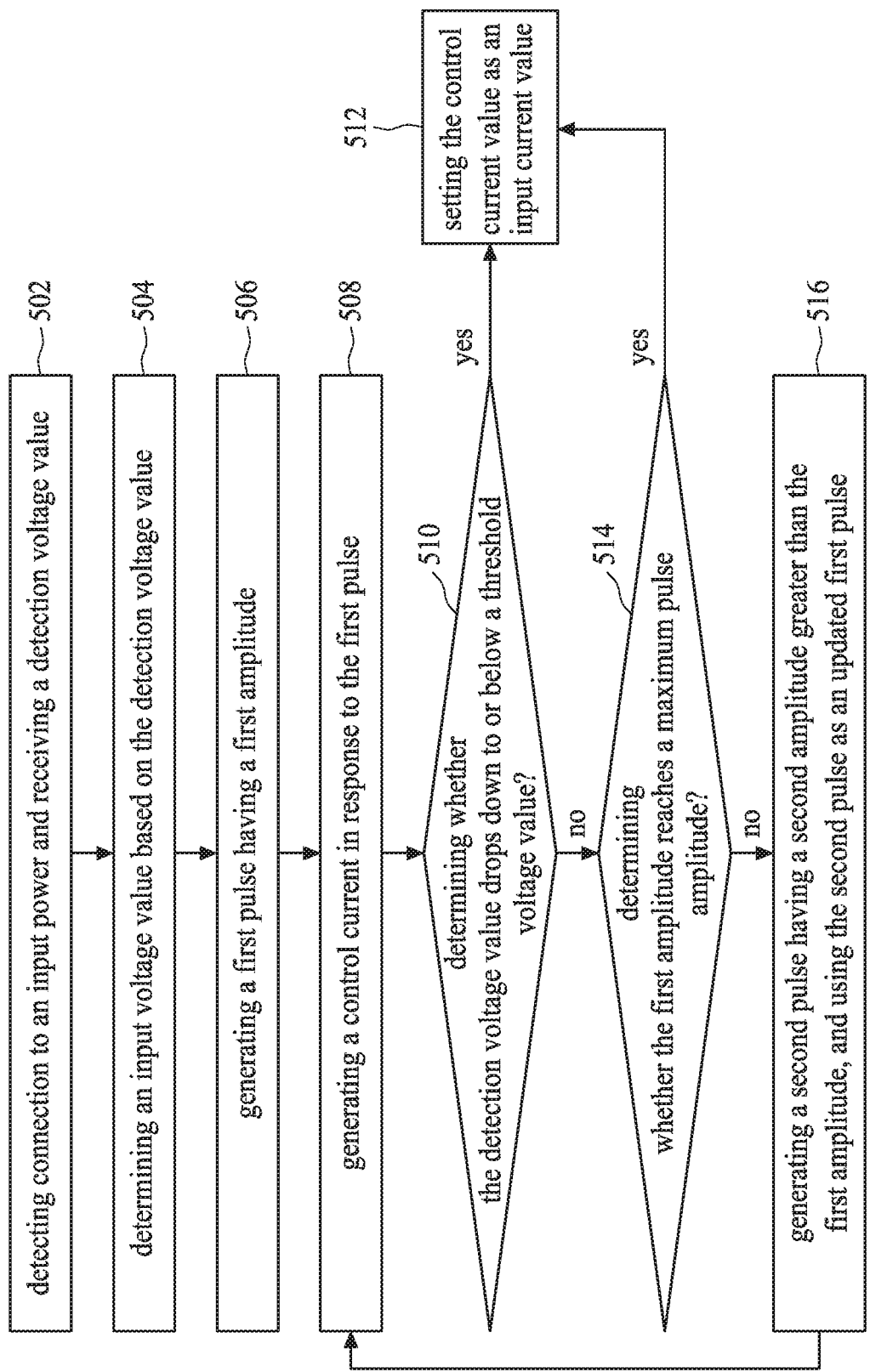
FIG. 5 is a flow diagram showing a method of input power detection, in accordance with some embodiments.

FIG. 5 is a flow diagram showing a method of input power detection in accordance with some embodiments. In operation 502, connection to the input power is detected, and a detection voltage value Vd is received. In operation 504, an input voltage value Vm of the input power Sm is determined based on the detected voltage value Vd, wherein the input voltage Vm represents the maximum voltage supported by the first device 110.

In operation 506, a first pulse having a pulse width and a first amplitude is generated. In operation 508, a control current Ie is generated in response to the first pulse.

In operation 510, it is determined whether the detected voltage value Vd drops down to or below a threshold voltage value Vx. If affirmative, then operation 512 proceeds. In operation 512, it is determined that the control current value Ie is set as an input current value Im of the input power Sm and the detection process is terminated. If the detection voltage value Vd does not drop to or below the threshold voltage value Vx, then operation 414 proceeds.

In operation 514, it is determined whether the first amplitude reaches a maximum pulse amplitude. If affirmative, then operation 512 proceeds where the control current value Ie is set as the input current value Im of the input power Sm and the detection process is terminated.

If the first amplitude does not reach the maximum pulse amplitude, then in operation 516, a second pulse having a second amplitude greater than the first amplitude is generated. The second pulse is employed in place of the first pulse and operation 508 is repeated. The second pulse is applied as an updated first pulse with a second amplitude in place of the first amplitude, whereby the second current Ie is generated. In one embodiment, the order of operations 510 and 514 may be interchanged, or performed simultaneously.

In the present disclosure, an electronic device comprises: an input power detection unit, configured to determine an input voltage value and an input current value of an input power; a transmission control unit, configured to determine a first voltage value and a first current value, based on the input voltage value and the input current value, associated with another electronic device through a handshake process; and a voltage converter, configured to provide a first power in response to convert the input power into the first power required by the another electronic device.

In an embodiment, the input power detection unit includes a voltage detection unit, configured to determine the input voltage value based on a detection voltage value.

In another embodiment, the input power detection unit further comprises a current control unit, configured to generate a second voltage value and a second current value in response to the input power.

In other embodiments, the voltage detection unit is configured in parallel connection with the current control unit.

In some embodiments, the input power detection unit further comprises a current detecting unit, configured to determine the input current value in response to the second voltage value.

In some embodiments, the current detection unit is configured to determine the second current value as the input current value in response to the detection voltage value dropping down to or below a threshold voltage.

In some embodiments, in response to the detection voltage value dropping down to or below the threshold voltage, the voltage detection unit is configured to send a signal to the current detection unit, whereby the second current value is determined as the input current value.

In some embodiments, the current control unit comprises a metal-oxide-semiconductor field-effect transistor (MOSFET) configured to generate the second current value from the input power, wherein the MOSFET comprises a source terminal with the second current value being a current value at the source terminal.

In some embodiments, the current control unit further comprises a resistor, and the second voltage value corresponds to the second current value through the resistor.

In some embodiments, the MOSFET further comprises a gate terminal, and the current control unit further comprises a pulse generation unit configured to send a first pulse having a first amplitude to the gate terminal.

In some embodiments, in response to the detection voltage value not dropping down to or below a threshold voltage, the pulse generation unit is configured to output a second pulse to the gate terminal, wherein the second pulse has a second amplitude greater than the first amplitude.

The present disclosure provides a method for detecting an input power, the method comprising: receiving a detection voltage value of the input power; determining an input voltage value of the input power based on the detection voltage value; generating a first pulse having a first amplitude; generating a control current value in response to the first pulse; and determining the control current value as an input current value in response to the detection voltage value dropping down to or below a threshold voltage value.

In some embodiments, the method further comprises, in response to the detection voltage value not dropping down the threshold voltage value, generating a second pulse having a second amplitude greater than the first amplitude in place of the first pulse.

In some embodiments, the method further comprises, in response to the first amplitude reaching a maximum amplitude, determining the control current value as an input current value of the input power.

In some embodiments, the control current is generated by a metal-oxide-semiconductor field-effect transistor (MOSFET) comprising a source terminal, the control current value being a current value at the source terminal.

In some embodiments, the MOSFET further comprises a gate terminal, and the first pulse is generated by a pulse generation unit and applied to the gate terminal.

In some embodiments, the first pulse has a first period during which the control current is generated and detected.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
   an input power detection unit, configured to determine an input voltage value and an input current value of an input power;
   a transmission control unit, configured to determine a first voltage value and a first current value, based on the input voltage value and the input current value, associated with another electronic device through a handshake process;
   a voltage converter, configured to convert the input power into a first power required by the another electronic device;
   wherein the input power detection unit includes a voltage detection unit, configured to determine the input voltage value based on a detection voltage value; and
   wherein the input power detection unit further comprises a current control unit, configured to generate a second voltage value and a second current value in response to the input power.

2. The electronic device according to claim 1, wherein the voltage detection unit is configured in parallel connection with the current control unit.

3. The electronic device according to claim 1, wherein the input power detection unit further comprises a current detecting unit, configured to determine the input current value based on the second voltage value.

4. The electronic device according to claim 3, wherein the current detection unit is configured to determine the second current value as the input current value in response to the detection voltage value dropping down to or below a threshold voltage.

5. The electronic device according to claim 4, wherein the voltage detection unit is configured, in response to the detection voltage value dropping down to or below the threshold voltage, to send a signal to the current detection unit, whereby the second current value is determined as the input current value.

6. The electronic device according to claim 1, wherein the current control unit comprises a metal-oxide-semiconductor field-effect transistor (MOSFET) configured to generate the second current value from the input power, the MOSFET comprising a source terminal with the second current value being a current value at the source terminal.

7. The electronic device according to claim 6, wherein the current control unit further comprises a resistor, and the second voltage value corresponds to the second current value through the resistor.

8. The electronic device according to claim 6, wherein the MOSFET further comprises a gate terminal, and the current control unit further comprises a pulse generation unit configured to send a first pulse having a first amplitude to the gate terminal.

9. The electronic device according to the claim 8, wherein the pulse generation unit is configured, in response to the detection voltage value not dropping down to or below a threshold voltage, to output a second pulse to the gate terminal, the second pulse having a second amplitude greater than the first amplitude.

10. A method for detecting an input power, the method comprising:
receiving a detection voltage value of the input power;
determining an input voltage value of the input power based on the detection voltage value;
generating a first pulse having a first amplitude;
generating a control current value based on the first pulse; and
determining the control current value as an input current value in response to the detection voltage value dropping down to or below a threshold voltage value.

11. The method according to claim 10, further comprising, in response to the detection voltage value not dropping down to or below the threshold voltage value, generating a second pulse having a second amplitude greater than the first amplitude in place of the first pulse.

12. The method according to claim 10, further comprising, in response to the first amplitude reaching a maximum amplitude, determining the control current value as an input current value of the input power.

13. The method according to claim 10, where the control current is generated by a metal-oxide-semiconductor field-effect transistor (MOSFET) comprising a source terminal, the control current value being a current value at the source terminal.

14. The method according to claim 13, wherein the MOSFET further comprises a gate terminal, and the first pulse is generated by a pulse generation unit and applied to the gate terminal.

15. The method according to claim 10, wherein the first pulse has a first period during which the control current is generated and detected.

* * * * *